United States Patent [19]

Cosentino et al.

[11] Patent Number: 4,701,775
[45] Date of Patent: Oct. 20, 1987

[54] BURIED N− CHANNEL IMPLANT FOR NMOS TRANSISTORS

[75] Inventors: Stephen J. Cosentino, Austin, Tex.; James M. Rugg, Tempe, Ariz.; Richard W. Mauntel, Austin, Tex.

[73] Assignee: Motorola, Inc., Schaumburg, Ill.

[21] Appl. No.: 789,673

[22] Filed: Oct. 21, 1985

[51] Int. Cl.[4] .................... H01L 29/78; H01L 27/02
[52] U.S. Cl. .................... 357/23.12; 357/42; 357/91; 357/90; 357/89
[58] Field of Search ............... 357/23.12, 42, 91, 90, 357/89

[56] References Cited

U.S. PATENT DOCUMENTS 4,053,925 10/1977 Burr et al. .................... 357/42
4,247,860 1/1981 Tihanyi ...................... 357/23.12
4,276,095 6/1981 Beilstein, Jr. et al. ......... 357/23.12

FOREIGN PATENT DOCUMENTS 0153367 11/1980 Japan ........................ 357/42

Primary Examiner—Martin H. Edlow
Assistant Examiner—Robert P. Limanek
Attorney, Agent, or Firm—John A. Fisher; Jeffrey Van Myers; David L. Mossman

[57] ABSTRACT

A deep, buried n− channel blanket implant beneath both n− channel and p-channel devices in MOS integrated circuits, whether complementary MOS (CMOS) or not. It is known to use deep, lightly-doped n− channel implant to improve the characteristics of p-channel (PMOS) devices, although one skilled in the art would expect such an n− implant to be detrimental to n-channel (NMOS) devices. It has been discovered that such implants not only do not degrade the NMOS devices, but in fact improve their performance, with respect to body effect and junction capacitance.

14 Claims, 2 Drawing Figures

BURIED N⁻ CHANNEL IMPLANT FOR NMOS TRANSISTORS

FIELD OF THE INVENTION

The invention relates to the fabrication of NMOS transistors, and, more particularly, relates to the use of buried doped implants to enhance the properties of and simplify the fabrication of NMOS transistors particularly when used in complementary MOS (CMOS) integrated circuits.

BACKGROUND OF THE INVENTION

In the ever-continuing effort to improve the performance of metal-oxide-silicon (MOS) devices it has been discovered that the current leakage properties of a short p-channel MOS (PMOS) transistor may be improved by introducing a deep arsenic implant underneath the shallow boron channel implant. See, for example, S. Chiang, et al. "Optimization of Sub-micron p-Channel FET Structure," *IEEE International Electronic Devices Meeting Papers*, Vol. 24.6 1983, pp. 534–537. The use of a deep, n⁻ channel implant under p-channel devices does not cause a process sequence problem if all of the devices on the integrated circuit under construction are PMOS, however, if this technique were used to enhance the characteristics of p-channel devices in CMOS, one skilled in the art would expect that a mask step would be necessary to prevent the deep, buried n⁻ channel implant from appearing under the n-channel devices present. The expectation is that an n⁻ channel implant under an NMOS device would create punch-through problems.

It would be desirable to discover a process by which the deep, buried n⁻ channel implant of PMOS devices could be applied to CMOS integrated circuits without the addition of an extra mask step.

SUMMARY OF THE INVENTION

Accordingly, it is an object of the present invention to provide a technique by which deep, n⁻ channel implant may be used to enhance NMOS devices whether used in an NMOS integrated circuit or a CMOS integrated circuit.

Another object of the invention is to provide a means by which a deep, n⁻ channel buried implant may be employed on CMOS transistors without the need for an extra mask step.

In carrying out these and other objects of the present invention, there is provided, in one form an n-channel MOS device made by performing a deep, lightly-doped n⁻ donor implant in a p acceptor doped region, then forming a thin gate oxide layer, performing boron channel implants, subsequently forming a heavily-doped n+ donor gate, and finally implanting heavily doped n+ donor source/drain regions. Optionally, the gate may be formed in two steps, one before and one after the boron channel implants.

DETAILED DESCRIPTION OF THE INVENTION

It has been surprisingly discovered that a deep, buried n⁻ channel implant beneath an NMOS device does not degrade transistor performance, particularly with regard to punch-through, and in fact benefits the NMOS device characteristics. It is expected that the principal application of this technique is in a CMOS process flow, where both NMOS and PMOS transistors are present. By virtue of this discovery, a mask need not be used in the formation of the deep n⁻ implant as it may be laid beneath both n-channel and p-channel devices in a CMOS integrated circuit.

Figure 1:
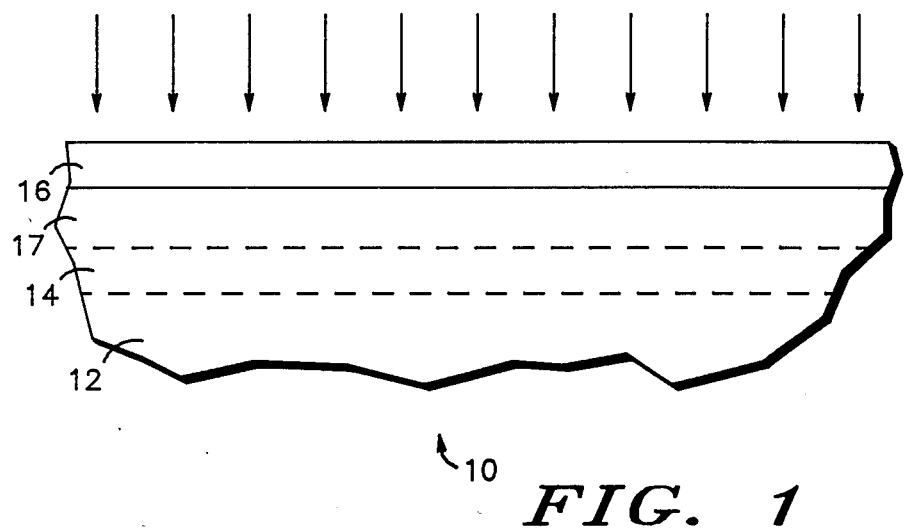
FIG. 1 is a cross-section of an n-channel MOS transistor under construction showing the blanket implantation of the deep, buried n⁻ implant through a sacrificial oxide layer.
Figure 2:
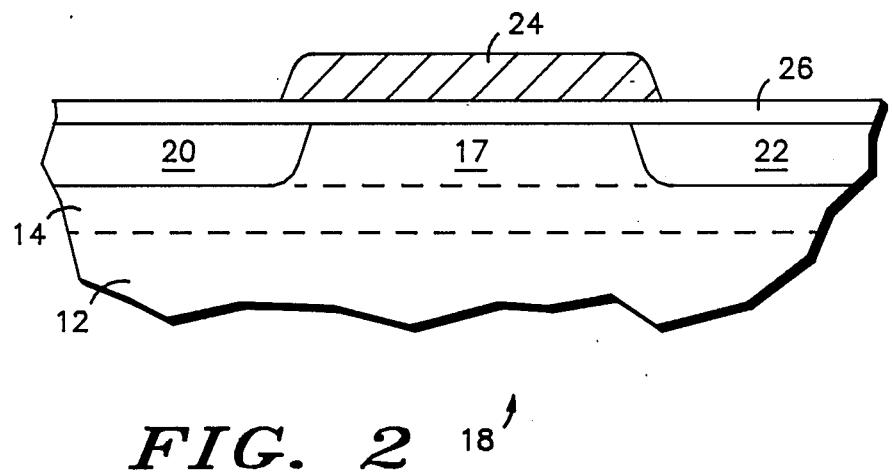
FIG. 2 is a cross-section of the n-channel MOS transistor of FIG. 1 in completed form.

Shown in FIG. 1 is an NMOS transistor 10 under construction. Fabrication taken place in a p-doped region 12, which can either be a p substrate or a p-well in an n-doped substrate; the present invention would work well in either situation. The deep n⁻ implant 14 is introduced into the channel region of both n- and p-channel transistors. This implant 14 is formed by the blanket or unmasked ion implantation of arsenic or phosphorus. The implant conducted as shown in FIG. 1 compensates back the p-type region 12 and p-channel region 17 with n-type dopant but does not bring them to a fully compensated or n⁻ state. The exact depth of the n⁻ implant is not critical; for example, it may be positioned at approximately 2000 angstroms below the surface as in the example described below. Preferably, the peak of the deep n⁻ channel implant 14 is at or below the n+/p junction of the eventual source 20 and drain 22 regions, as seen in FIG. 2. This implant 14 is dependent upon the other device parameters for its exact depth placement. The downward pointing arrows in FIG. 1 indicate the ion implantation step.

Since the implant must be done at fairly high energies, it may be preferred to implant through a thin implant screen, which in many cases will be silicon dioxide as represented at 16 in FIG. 1. Typically, this implant screen will be a sacrificial oxide layer 16. In the example, a 400 angstrom layer was used. Its exact thickness is, of course, dependent on the nature of the devices being built.

As noted above, it is well known that buried implant 14 improves the punchthrough properties of p-channel devices. But it is surprising to find that implant 14 also improves the performance of the final n-channel transistor 18 shown in FIG. 2. Finished NMOS transistor 18 has an n⁻ channel implant 14 buried in p-doped region 12, and also possesses p⁻ channel region 17, source region 20, drain region 22 and gate region 24 on thin dielectric layer 26. For an NMOS transistor 18, source 20, drain 22 and gate 24 are heavily n+ doped regions of silicon. Typically, gate region 24 is polycrystalline silicon (polysilicon) and the thin gate dielectric layer 26 is silicon dioxide, although the invention is not limited by these suggestions of possible materials.

As will be shown, both the variations of threshold voltage with substrate bias, called the "body effect", and n+/p source/drain junction capacitance are reduced by a factor of 1.5 to 2. The punchthrough properties of the n-channel device exhibit no degradation due to the n⁻ implant 14. The invention will be further illustrated with reference to the following example.

EXAMPLE 1

This experiment focused on improving the short channel leakage properties of PMOS devices by introducing a deep arsenic implant below the boron channel implant normally employed. The effects of the blanket arsenic implant on NMOS devices were also studied which led to the discovery of this invention. In an earlier experiment it was found that light doses of arsenic (less than or equal to $1 \times 10^{11}$ atoms/cm$^2$) were insufficient to have much effect. Therefore, relatively heavier doses (3, 5 and $7 \times 10^{11}$, commonly expressed as 7E11, for example) were used in the present experiment. The arsenic ion implantation was performed through 400 angstroms of sacrificial gate oxide. The boron ion implantation was performed through 500 angstroms of polysilicon and 250 angstroms of gate oxide. The results are summarized in the tables below.

TABLE I

| p-Channel Results | | | | |
|---|---|---|---|---|
| Blanket B+ dose (30 keV) | Blanket As+ dose (360 keV) | $V_{TLCH}$ (V)$^a$ | $V_T$ at $L_{eff}$ = 0.7 um$^b$ | $I_L$ at $L_{eff}$ = 0.7 um$^c$ |
| 6.5 E11 | 3 E11 | −1.05 V | −0.53 V | >1 E-8 A/um |
| 8 E11 | 5 E11 | −1.04 V | −0.57 V | 2.5 E-11 A/um |
| 9 E11 | 7 E11 | −1.05 V | −0.65 V | 5 E-12 A/um |
| 4.5 E11 | None (control) | −1.00 V | −0.32 V | >1 E-8 A/um |

$^a V_{BB} = 0$ V, $V_{TLCH}$ = Long channel (L = 50 um) threshold voltage.
$^b V_{DS} = -5$ V, $V_{BB} = 0$ V.
$^c$Leakage current at $V_{DS} = -5$ V, $V_{GS} = -0.3$ V, $V_{BB} = 0$ V.

The results show an improvement in short channel behavior as the arsenic dose is increased. The reduction in threshold voltage $V_T$ with shorter $L_{eff}$ is minimized and the leakage current is reduced, for devices with $L_{eff}$ greater than or equal to 0.7 μm.

TABLE II

| n-Channel Results | | | | | | | |
|---|---|---|---|---|---|---|---|
| Net Enh. B+ Dose 30 keV | As+ Dose 360 keV | $V_{TLCH}$ (V)$^a$ | $V_T$ at $L_{eff}$ = 0.8 um$^b$ | $\Delta V_T$ 0-5 V $V_{BB}$ | n+/p Cj$^c$ 0 V | 5 V | $I_L$ at $L_{eff}$ = 0.8 um$^d$ |
| 2.9 E12 | 7 E11 | 1.07 V | 0.87 V | 0.63 V | 0.2 | .073 | 3 E-12 A/um |
| 2.45 E12 | None (control) | 0.94 V | 0.90 V | 1.15 V | 0.3 | .10 | 3 E-12 A/um |

$^a$Long channel (L = 50 um) threshold voltage, $V_{BB} = 0$ V.
$^b V_{DS} = 5$ V, $V_{BB} = 0$ V.
$^c$Junction capacitance in fF/um$^2$
$^d$Leakage current at $V_{DS} = 5$ V, $V_{GS} = 0.3$ V, $V_{BB} = 0$ V The results for the n-channel devices show that a substantial reduction in body effect (the change in $V_{TH}$ as $V_{BB}$ varies from 0 to −5 V) and junction capacitance ($C_J$) as compared with the control, may be obtained using a deep n− implant. Punchthrough effects, indicated by $I_L$, show no degradation.

We claim:

1. An n-channel MOS device in a p acceptor doped region of a semiconductor substrate surface made by the process comprising the steps of:
   forming a deep layer containing n donors within the surface of the semiconductor substrate including within the p acceptor doped region, but not containing enough n donors to fully compensate the p acceptor doped region;
   forming a thin gate oxide layer on top of the surface of the semiconductor substrate;
   patterning and forming a gate on the thin gate oxide layer; and
   forming heavily-doped n+ donor source/drain regions within the surface of the semiconductor substrate adjacent the gate, having junctions with the p acceptor doped region.

2. The n-channel MOS device of claim 1 in which the deep layer containing n donors within the p acceptor region has a peak donor concentration region and the peak donor concentration region lies at or below the junction of the heavily doped n+ source/drain regions and the p acceptor doped region.

3. The n-channel MOS device of claim 1 in which the deep layer containing n donors within the p acceptor region employs donors selected from the group consisting of phosphorus or arsenic.

4. The n-channel MOS device of claim 1 in which a sacrificial oxide layer is formed on top of the surface of the semiconductor substrate including the p acceptor doped region prior to the formation of the deep layer, and in which the formation of the deep layer containing n donors is performed by implantation through the sacrificial silicon dioxide layer.

5. An n-channel MOS transistor in a p acceptor doped region made by the process comprising the steps of:
   forming a deep layer containing n donors within the entire surface of the semiconductor substrate including within the p acceptor doped region, but not enough n donors to fully compensate the p acceptor doped region, forming the deep layer in the absence of a mask, and where the deep layer containing n donors has a peak donor concentration region;
   forming a thin gate oxide layer on top of the surface of the semiconductor substrate;
   patterning and forming a gate on the thin gate oxide layer in selected regions of the thin gate oxide layer; and
   implanting heavily-doped n+ donor source/drain regions around the gate into the p acceptor doped region, such that the peak donor concentration region of the deep layer containing n donors lies at or below a bottom junction of the source/drain regions and the p acceptor doped region.

6. The n-channel MOS transistor of claim 5 in which the deep layer containing n donors employs donors selected from the group consisting of phosphorus or arsenic.

7. The n-channel MOS transistor of claim 5 in which a sacrificial oxide layer is formed on the entire surface of the semiconductor substrate, including the p acceptor doped region prior to the formation of the deep layer and in which the formation of the deep layer containing n donors is performed by implantation through a sacrificial silicon dioxide layer.

8. An integrated circuit comprising n-channel MOS transistors in a p acceptor region made by the process comprising the steps of:
   forming a deep layer containing n donors within the entire surface of the semiconductor substrate including the p acceptor doped region in the absence of a mask, where the deep layer does not contain enough n donors to fully compensate the p acceptor doped region, where the deep layer containing n donors has a peak concentration region designed to be positioned at or below the bottom of subsequently formed heavily doped n+ donor source/drain regions, but within the p acceptor doped region;

forming a thin gate oxide layer over the entire surface of the semiconductor substrate;

patterning and forming a heavily-doped n+ donor gate in selected areas of the thin gate oxide layer; and implanting heavily-doped n+ donor source/drain regions around the heavily-doped n+ donor gate.

9. The integrated circuit of claim 8 in which the deep layer containing n donors employs donors selected from the group consisting of phosphorus or arsenic.

10. The integrated circuit of claim 8 in which a sacrificial oxide layer is formed on the entire surface of the semiconductor substrate, including the p acceptor doped region prior to the formation of the deep layer and in which the deep layer containing n donors is performed by implantation through the sacrificial silicon dioxide layer.

11. An n-channel MOS device in a p acceptor doped region of a semiconductor substrate surface comprising:
   a thin gate oxide layer over the surface of the semiconductor substrate;
   a gate of conductive material on the gate oxide layer;
   n-doped source/drain regions in the p acceptor doped region below the gate oxide layer and adjacent the gate of conductive material; and
   a deep layer containing n dopants within the p acceptor doped region beneath the n-doped source/drain regions, wherein the amount of n dopants in the deep layer in the p acceptor region is insufficient to fully compensate the layer.

12. The n-channel MOS device of claim 11 wherein the deep layer containing n dopants is effectively compensated to be a lightly doped p layer.

13. The n-channel MOS device of claim 11 wherein a p-channel MOS device is also present in the semiconductor substrate surface, and the p-channel MOS device comprises p-doped source/drain regions in an n donor doped region, and the deep layer containing n dopants is also present within the n donor doped region beneath the p-doped source/drain regions.

14. The n-channel MOS device of claim 13 wherein the deep layer containing n dopants is effectively the same distance from the n-doped source/drain regions in the p acceptor doped region as from the p-doped source/drain regions in the n donor doped region.

* * * * *